United States Patent
Uddin

(10) Patent No.: US 10,229,952 B2
(45) Date of Patent: Mar. 12, 2019

(54) PHOTOVOLTAIC CELL AND A METHOD OF FORMING A PHOTOVOLTAIC CELL

(71) Applicant: Newsouth Innovations PTY Limited, UNSW Sydney, New South Wales (AU)

(72) Inventor: Ashraf Uddin, Hillsdale (AU)

(73) Assignee: NEWSOUTH INNOVATIONS PTY LIMITED, Sydney (AU)

(*) Notice: Subject to any disclaimer, the term of this patent is extended or adjusted under 35 U.S.C. 154(b) by 0 days.

(21) Appl. No.: 15/503,075

(22) PCT Filed: Aug. 10, 2015

(86) PCT No.: PCT/AU2015/000477
§ 371 (c)(1),
(2) Date: Feb. 10, 2017

(87) PCT Pub. No.: WO2016/023064
PCT Pub. Date: Feb. 18, 2016

(65) Prior Publication Data
US 2017/0229518 A1  Aug. 10, 2017

(30) Foreign Application Priority Data
Aug. 11, 2014 (AU) ................................ 2014903112

(51) Int. Cl.
*H01L 27/30* (2006.01)
*H01L 51/42* (2006.01)
*H01G 9/20* (2006.01)

(52) U.S. Cl.
CPC ......... *H01L 27/302* (2013.01); *H01G 9/2009* (2013.01); *H01G 9/2054* (2013.01);
(Continued)

(58) Field of Classification Search
CPC ..... H01L 31/00; H01L 31/02; H01L 31/0248; H01L 31/0256; H01L 31/0264;
(Continued)

(56) References Cited

U.S. PATENT DOCUMENTS 8,563,855 B2  10/2013 Pschirer et al.
2006/0162767 A1  7/2006 Mascarenhas et al.
(Continued)

FOREIGN PATENT DOCUMENTS

CN  103956431 A  7/2014

OTHER PUBLICATIONS

Chen et al. ("Perovskite/polymer monolithic hybrid tandem solar cells utilizing a low-temperature, full solution process"); Mater. Horiz. 2015, 2, 203-211.*
(Continued)

*Primary Examiner* — Christina Chern
(74) *Attorney, Agent, or Firm* — Ballard Spahr LLP

(57) ABSTRACT

The present disclosure provides a photovoltaic device and a method for forming the photovoltaic device. The photovoltaic device comprises a first solar cell structure having a photon absorbing layer comprising an organic material having a first bandgap; and a second solar cell structure having a photon absorbing layer comprising a material that has a Perovskite structure and having a second bandgap. The first and second solar cell structures are positioned at least partially onto each other.

14 Claims, 8 Drawing Sheets

(52) U.S. Cl.
CPC ....... *H01G 9/2072* (2013.01); *H01L 51/4233* (2013.01); *H01L 51/4253* (2013.01); *H01L 51/4273* (2013.01); *H01L 51/422* (2013.01); *Y02E 10/549* (2013.01); *Y02P 70/521* (2015.11)

(58) Field of Classification Search
CPC ............. H01L 31/0344; H01L 31/0352; H01L 31/043; H01L 31/0725; H01L 51/00; H01L 51/42; H01L 51/4213; H01L 51/44; H01G 9/2072; H01G 9/2009
See application file for complete search history.

(56) References Cited

U.S. PATENT DOCUMENTS

| | | | |
|---|---|---|---|
| 2010/0116315 A1* | 5/2010 | Clark | H01L 31/02322 136/244 |
| 2010/0301320 A1* | 12/2010 | Rand | B82Y 10/00 257/40 |
| 2012/0060918 A1* | 3/2012 | Spitzer | H01L 31/055 136/257 |
| 2014/0332078 A1* | 11/2014 | Guo | H01L 51/424 136/261 |
| 2015/0340632 A1* | 11/2015 | Etgar | H01L 51/4226 136/255 |

OTHER PUBLICATIONS

Gao, P. et al., "Organohalide Lead Perovskites for Photovoltaic Applications," Energy and Environmental Science, 2014, vol. 7, No. 8, pp. 2448-2463.
Kojima, A. et al., "Organometal Halide Perovkites as Visible Light-Sensitizers for Photovoltaic Cells," Journal of the American Chemical Society, 2009, vol. 131, No. 17, pp. 6050-6051.
Kazim, S, et al., "Perovskite as light harvester: a game changer in photovoltaics," Angewandte Chemie International Edition, 2014, vol. 53 No. 11, pp. 2812-2824.
International Search Report and Written Opinion dated Oct. 2, 2015, for application PCT/AU2015/000477, filed on Aug. 10, 2015 and published as WO 2016/023064 on Feb. 18, 2016 (Applicant—Newsouth Innovations Pty Limited // Inventor—Uddin) (8 pages).

* cited by examiner

PHOTOVOLTAIC CELL AND A METHOD OF FORMING A PHOTOVOLTAIC CELL

CROSS-REFERENCE TO RELATED APPLICATIONS

The present application is a U.S. National Phase Application of International Application No. PCT/AU2015/000477, filed Aug. 10, 2015, which claims priority to Australian Patent Application No. 2014903112, filed Aug. 11, 2014, each of which are hereby incorporated by reference in their entirety.

FIELD OF THE INVENTION

The present invention generally relates to organic photovoltaic thin film devices comprising organic tandem thin films solar cells.

BACKGROUND OF THE INVENTION

The majority of commercial photovoltaic modules based on silicon solar cells utilise solar cells fabricated using high quality silicon wafer. Despite the constant drop of silicon prices over the last few years, the cost of silicon still represents a large portion of the final price of these photovoltaic modules.

Substantial investments have been made in the last 10 years to develop photovoltaic devices which use inexpensive materials, possibly in very small quantities. These photovoltaic devices are often referred to as thin film solar cells. Cadmium telluride cells are an example of a thin film solar cell technology which had a major commercial success and competes on the marked with conventional wafer-based silicon cells.

Some thin film solar cell technologies are based on organic photoactive layers (OPVs). Generally these layers are realised using solution-processable materials and can be fabricated over large areas on rigid or flexible substrates. Potentially OPVs may become as inexpensive as paint in terms of processing and fabrication cost.

Critical challenges faced by OPV technology relate to the low power conversion efficiency (PCE) of devices. The PCE of current single cell OPV device is around 8%. This low value of efficiency is due to the inability of OPVs to convert a large part of the solar spectrum, given the narrow absorption range, and the low values of carrier mobility, which forces device to have a thin absorbing layer.

A possible approach to increase the PCE of OPVs is to utilise an OPV cell in synergy with another photovoltaic device in a stack configuration. This technique has been adopted, for example, with some silicon based thin film solar cells. Using two or more cells in a stacked configuration allows exploiting the solar spectrum and improving the overall performance of the device.

However, OPVs have peculiar chemical and structural properties and the challenge has been to develop performing photovoltaic materials that can be used together with OPVs reliably.

SUMMARY OF THE INVENTION

In accordance with a first aspect, the present invention provides a photovoltaic device comprising:
a photon receiving surface;
a first solar cell structure having a photon absorbing layer comprising an organic material having a first bandgap; and
a second solar cell structure having a photon absorbing layer comprising a material that has a Perovskite structure and having a second bandgap;
wherein one of the first and second solar cell structures is positioned at least partially below the other one of the first and second solar cell structures and the photovoltaic device is arranged such that received photons are absorbed by at least one of the first and the second solar cell structure.

In embodiments, the first bandgap is larger than the second bandgap and the first solar cell is disposed between the photon receiving surface and the second solar cell.

In some embodiments, the photovoltaic device comprises a photon energy converting layer arranged to convert received photons having energy below the smaller of the first and second bandgap energies into photons with energy above the smaller of the first and second bandgap energies. In these embodiments, the device is arranged such that energy converted photons are absorbed by at least one of the first and the second solar cell structure.

The photon energy converting layer may be disposed adjacent the photon receiving surface and may include a portion of the photon receiving surface. Alternatively, the photon energy converting layer may be disposed between the first solar cell and the second solar cell. In another alternative configuration, the photon energy converting layer is disposed between a conductive layer arranged to extract electrical carriers from the device and the solar cell with the smaller of the first and second bandgap. The conductive layer may comprise silver. The photon energy converting layer may comprise $NaYF_4:Er$.

In embodiments, the photovoltaic device according to any one of the preceding claims further comprises an interconnecting region between the first solar cell and the second solar cell, the interconnecting region is arranged to facilitate the passage of current between the first and the second solar cell. The interconnecting region may extend across at least a portion of the first or the second solar cell. Further, the interconnecting region may comprise one or more intermediate layers disposed between the photon absorbing layer of the first solar cell and the photon absorbing layer of the second solar cell.

In an embodiment, at least one intermediate layer is arranged to reduce passage of electrons or holes from one solar cell to the other. The at least one intermediate layer may comprise a ZnO layer or a $MoO_3$ layer.

In an embodiment, at least one intermediate layer is arranged to facilitate recombination of electrons coming from one solar cell with holes coming from the other solar cell.

In some embodiments, the at least one intermediate layer is arranged to alter the distribution of electrical field within at least one of the first and the second solar cell. The at least one intermediate layer may be a conductive layer and may comprise PEDOT:PSS. Typically, the at least one intermediate layer has a thickness between 40 nm and 200 nm.

One of the first and second solar cells may comprise a hole-transport material disposed at an anode portion of the solar cell which facilitates the transport of holes from the solar cell to a contact structure. The other one of the first and second solar cells may comprise an electron-transport material disposed at a cathode portion of the solar cell which facilitates the transport of holes from the solar cell to a contact structure.

In some embodiments, the Perovskite material in the absorbing layer of the second solar cell comprises any one or a combination of MAPb $(I_{(1-x)}Br_x)_3$, MAPb$_{(1-x)}$Sn$_x$I$_3$, CH$_3$NH$_3$Pb(I$_{(1-x)}$Br$_x$)$_3$, CH$_3$NH$_3$Pb$_{(1-x)}$Sn$_x$I$_3$ or CH$_3$NH$_3$PbI$_3$. The Perovskite material may be a self-assembled material and may comprise an inorganic-organic compound. The Perovskite material may also comprise Al$_2$O$_3$, SrTiO$_3$ or TiO$_2$. Typically, the Perovskite material may have a thickness between 500 nm and 1500 nm.

In some embodiments, the organic material of the photon absorbing layer of the first solar cell comprises a donor semiconductive polymer. The donor semiconductive polymer may comprise any one or a combination of Poly[[4,8-bis [(2-ethylhexyl) oxy] benzo [1,2-b:4,5-b'] dithiophene-2,6-diyl] [3-fluoro-2-[(2-ethylhexyl) carbonyl] thieno [3,4-b] thiophenediyl]] (PTB7), PCPDTBT and P3HT. Typically, the donor semiconductive polymer is blended with an electron acceptor material to form a photoactive layer. The electron acceptor material may comprise PC$_{70}$BM. The organic material may have a thickness between 20 nm and 400 nm.

In accordance with a second aspect, the present invention provides a method of manufacturing a photovoltaic device comprising the steps of:
providing a substrate;
depositing a first solar cell structure having first photon absorbing layer; and
depositing a second solar cell structure having a second photon absorbing layer;
wherein one of the first and second solar cell structures is positioned at least partially below the other one of the first and second solar cell structures and one of the first and second photon absorbing layers comprises a Perovskite material and the other one of photon absorbing layers comprises an organic material.

In an embodiment, the step of depositing a first solar cell structure comprises the step of spin coating a photoactive organic material.

In an embodiment, the step of depositing a first solar cell structure comprises the step of spin coating a ZnO layer to reduce passage of holes from the first solar cell structure to a contacting structure adjacent the first solar cell structure.

In embodiments, the step of depositing a second solar cell structure comprises the step of spin coating or thermally growing a Perovskite material. Further, the step of depositing a second solar cell structure may comprise the step of spin coating a ZnO layer to reduce passage of holes from the second solar cell structure to the first solar cell structure or thermally depositing a MoO$_3$ layer to reduce passage of electrons from the second solar cell to a contacting structure adjacent the second solar cell structure.

The method may also comprise the step of spin coating a conductive intermediate layer after depositing the first solar cell and before depositing the second solar cell, the intermediate layer being arranged to facilitate recombination of electrons coming from one solar cell with holes coming from the other solar cell.

In some embodiments, the first solar cell has a first bandgap and the second solar cell has a second bandgap, the second bandgap being smaller than the first bandgap, and the method further comprises the step of depositing a photon energy converting layer arranged to convert photons received by the photovoltaic device having an energy below the second bandgap energy into photons with an energy above the second bandgap energy. The photon energy converting layer may comprises NaYF4:Er.

Advantageous embodiments provide a photovoltaic device which comprises an organic solar cell and a Perovskite solar cell operating together to efficiently convert light in the solar spectrum. The two solar cells are typically arranged in a stack so that the first cell which is exposed to the solar radiation absorbs a portion of the radiation and converts it into electron-hole pairs. The remaining portion, which is not absorbed by the first cell, is transmitted by the first cell to the second cell and at least partially absorbed in the second cell. The portion of spectrum which is not absorbed by any of the two cells may be up-converted by an energy conversion layer and subsequently absorbed by one of the cells. This configuration provides a photovoltaic device with an improved efficiency than the single organic or Perovskite materials based solar cells.

BRIEF DESCRIPTION OF THE DRAWINGS

Features and advantages of the present invention will become apparent from the following description of embodiments thereof, by way of example only, with reference to the accompanying drawings in which.

DETAILED DESCRIPTION OF EMBODIMENTS

Figure 1:
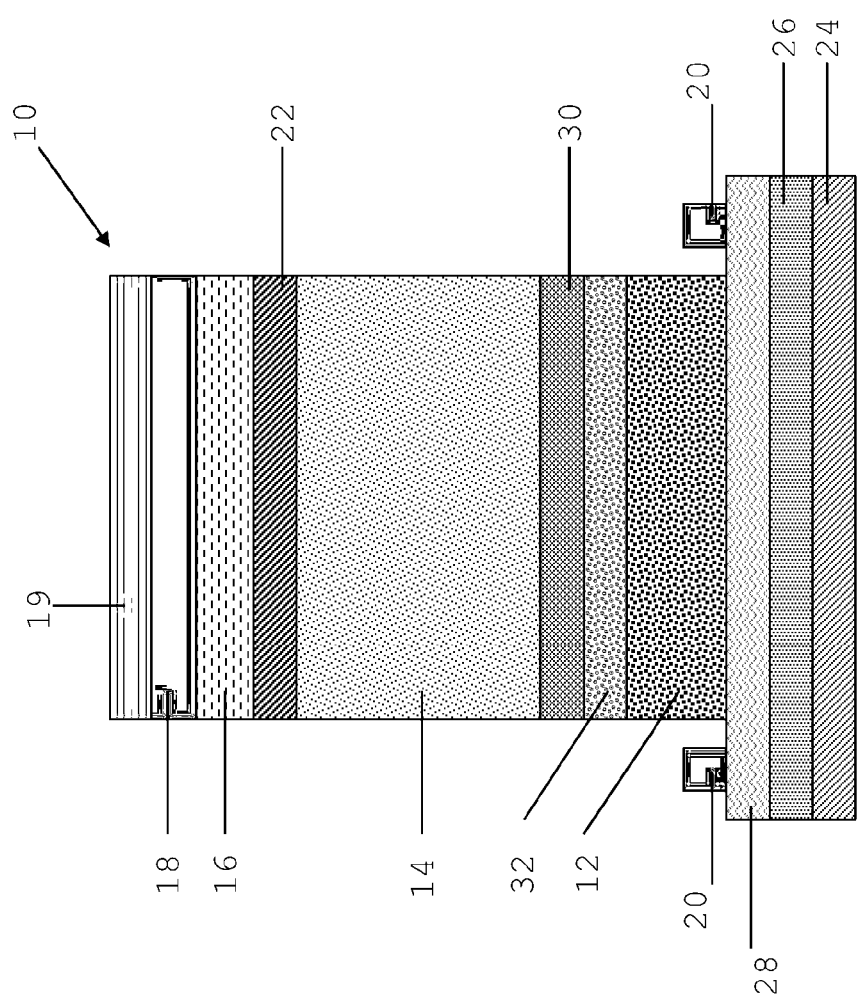
FIG. 1 is a schematic illustration of a cross-section of a tandem photovoltaic device in accordance with an embodiment.

Embodiments described herein are directed to a photovoltaic device which has a photon receiving surface, a first solar cell having a photon absorbing layer which comprises an organic material; and second solar cell having a photon absorbing layer which comprises a Perovskite material. The photons received by the photon receiving surface are absorbed by at least one of the first and the second solar cell structures.

In the embodiments described below the first organic solar cell is disposed between the second Perovskite solar cell and a transparent substrate and has a larger bandgap than the Perovskite solar cell. The organic solar cell is thinner than the Perovskite solar cell. However, in alternative embodiments the two cells may be disposed in the opposite order.

The top organic cell receives photons, through the transparent substrate, before the bottom Perovskite cell. Photons not absorbed by the top organic solar cell can be absorbed by the bottom Perovskite solar cell. This device design provides improved power conversion efficiency (PCE) and stability of the device.

A contribution to the improved PCE is provided by the increased open circuit voltage ($V_{OC}$) of the photovoltaic device. The $V_{OC}$ of the photovoltaic device is the sum of the $V_{OC}$ of the top and the bottom solar cells. Another contribution to the improved PCE is provided by the increased photocurrent due to better absorption of the solar spectrum over the first and the second solar cells. An increased photocurrent, in particular in the bottom cell, is also due to the increased electric field which develops over this cell during operation. This reduces the electric field across the top solar cell and enhances the effective field across the bottom sub-cell. In short-circuit conditions the top cell operates in a forward bias mode while an equally large opposite reverse bias applies to the bottom cell. This reverse bias assists the collection of charge carriers in the organic based solar cell, which typically exhibits a field assisted collection.

A methyl ammonium lead halide may be used to form the photon absorbing layer of the Perovskite cell, such as $MAPbX_3$, where X is a halogen. The methyl ammonium compound may be $CH_3NH_3$ and its mixed-halide crystals. The $CH_3NH_3PbX_3$ provides a three-dimensional Perovskite structure. These Perovskite structures can generally be deposited by low temperature solution methods (typically spin-coating). The low energy and ease of deposition provides a substantial advantage in the manufacturing process of the photovoltaic device. The band gap of $MAPbX_3$ may be tuned by chemical management of the compound, for example by mixing methyl ammonium triiodide plumbate with the tribromide $MAPb(I_{(1-X)}Br_X)_3$ or $CH_3NH_3Pb(I_{(1-X)}Br_X)_3$ or triiodide stannate $MAPb_{(1-X)}Sn_XI_3$ or $CH_3NH_3Pb_{(1-X)}Sn_XI_3$.

Bandgap tuning may be used to optimise the absorption of the photovoltaic device and/or the electrical performance. Further, bandgap tuning may be utilised to produce an array of translucent cell colours. This capability can be used to create colourful solar designs for various building applications, such as in replacing windows, roofs, and even walls.

$CH_3NH_3PbI_3$ for example is a Perovskite with high charge-carrier mobility and high charge carrier lifetimes. These properties are advantageous for the use of this material in the bottom cell of the photovoltaic device. Diffusion lengths above 1 μm have been demonstrated for both electrons and holes in this Perovskite.

The large diffusion lengths in the Perovskite bottom cell may provide an increase in the quantum efficiencies and photocurrents of the photovoltaic device. Further, the Perovskite bottom cell typically provides good values of $V_{OC}$ given the Perovskite electronic band gap.

Referring now to FIG. 1, there is shown a schematic representation of a cross-section of a photovoltaic device 10 in accordance with an embodiment. The device is configured as an inverted tandem device with a top organic solar cell between a substrate and a bottom Perovskite cell. The photon receiving surface of device 10 is disposed adjacent to a substrate. The substrate is provided as glass substrate 24. Alternatively a transparent polymeric substrate can be used, such as a plastic flexible substrate. The inverted configuration provides an improved stability for the photovoltaic device. The photovoltaic device 10 comprises a first solar cell structure having a photon absorbing layer comprising an organic material with a first bandgap. This is provided as organic layer 12. The photovoltaic device 10 also comprises a second solar cell structure having a photon absorbing layer which comprises a material that has a Perovskite structure and has a second bandgap. This is provided as Perovskite layer 14. The bandgap of organic layer 12 is larger than the bandgap of Perovskite layer 14. Typically organic layer 12 has a bandgap between 1.3 eV and 1.8 eV and Perovskite layer 14 has a bandgap between 1.2 eV and 1.5 eV.

In device 10 the first solar cell is formed by the photon absorbing organic layer 12, a hole barrier layer, provided as ZnO layer 28, and an electron barrier, provided by a PTB7 material 32. The PTB7 material is incorporated in the organic layer 12. The ZnO may be provided as a layer comprising ZnO nanoparticles. The first solar cell is deposited on a glass substrate 24 covered by a conductive dielectric layer, provided as ITO layer 26. The second solar cell is formed by Perovskite absorber 14, a hole barrier layer, provided as ZnO layer 30 and an electron barrier layer, provided as $MoO_3$ layer 22.

The photovoltaic device 10 also comprises a photon energy converting layer arranged to convert received photons, having energy below the smaller of the first and second bandgap energies, into photons with energy above the smaller of the first and second bandgap energies. The photon energy converting layer is provided as up-converting layer 16. The up-converting layer 16 is disposed between the second solar cell and a metallic contact 18 arranged to extract holes from device 10. The metallic contacting structure 18 comprises a pattern of silver contacts or a planar silver layer. The up-converting layer 16 includes a NaYF4: Er material. A further metallic contacting structure 20 is in electrical contact with the first solar cell and is arranged to extract electrons from device 10.

Incoming photons reach glass substrate 24 and are transmitted through glass substrate 24. The photons reach the photon receiving surface of device 10 and to the first solar cell. A portion of these photons is absorbed by organic layer 12 and converted in electron-hole pairs in the first solar cell. The majority of these converted photons have an energy which is higher than the bandgap of organic layer 12. A further portion of photons, generally with energy lower than the bandgap of organic layer 12, is transmitted through the first solar cell to the second solar cell. A portion of these transmitted photons is absorbed in the Perovskite layer 14 and converted in electron-hole pairs in the second solar cell. The majority of these photons, converted in the second solar cell, have an energy which is higher than the bandgap of Perovskite layer 14.

Photons received by the photon receiving surface having an energy which is smaller than the bandgap of organic layer 12 and Perovskite layer 14 may be transmitted through the first and the second solar cell. At least a portion of these photons is absorbed by up-converting layer 16 and converted into photons with energy higher than the bandgap of the Perovskite layer 14. At least a portion of these converted photons are absorbed and converted by the first or the second solar cell. Photons which are not absorbed by the up-converting layer 16 during their first pass through layer 16 may be reflected by the metallic contact 18 and be absorbed by the up-converting layer 16 during their second pass.

Photons could also be reflected by the encapsulation layer of the solar cell, provided in device 10 as layer 19. In this embodiment, encapsulation layer 19 is provided as a layer of graphene material. Encapsulation layer 19 may comprise a polymeric layer, ETC or other material suitable to provide encapsulation.

In alternative embodiments, up-converting layer 16 is disposed between the first solar cell and the glass substrate 24. In these embodiments photons are 'up-converted' before reaching the first solar cell. The higher energy of the photons increases the probability of absorption in the first or second solar cell.

In further alternative embodiments, up-converting layer 16 is disposed between the first solar cell and the second solar cell. In these embodiments, photons with energy lower than the bandgap of organic layer 12 are transmitted through organic layer 12 to the up-converting layer 16. Up-converted photons reflected by up-converting layer 16 may be re-absorbed by organic layer 12, while up-converted photons transmitted by up-converting layer 16 have a higher probability of being absorbed by Perovskite layer 14.

Photovoltaic device 10 also comprises an interconnecting region disposed between the first solar cell and the second solar cell. This region facilitates the passage of current between the first and the second solar cells. This region may extend across portions of the first or the second solar cells. In device 10 this region comprises ZnO layer 30 and an intermediate layer disposed between organic layer 12 and ZnO layer 30. The intermediate layer consists of a conductive layer 32 comprising a PEDOT:PSS material. The PEDOT:PSS material has a thickness between 40 nm and 200 nm and may also act as an optical spacer.

Conductive layer 32 allows recombination of holes coming from the first solar cell with electrons from the second solar cell facilitating the electrical series interconnection between the two solar cells. The presence of conductive layer 32 in the middle of device 10 also allows altering the distribution of the electric field on the first and the second solar cells in operation. This field distribution may be varied, for example by varying the thickness of layer 32, to improve the electrical output of device 10.

Perovskite layer 14 comprises $MAPb(I_{(1-x)}Br_x)_3$ and/or $MAPb_{(1-x)}Sn_xI_3$ materials with a thickness between 500 nm and 1500 nm. In particular $CH_3NH_3Pb(I_{(1-x)}Br_x)_3$ and/or $CH_3NH_3Pb_{(1-x)}Sn_xI_3$ which are self-assembled inorganic-organic Perovskite compounds. In alternative embodiments, Perovskite layer 14 may comprises any one or a combination of $Al_2O_3$, $SrTiO_3$ and $TiO_2$. The chemical composition of Perovskite layer 14 can be varied by varying the amounts of Br or Sn in the film allowing tuning of the bandgap of layer 14.

Organic layer 12 comprises a donor semiconductive polymer based on any one or a combination of Poly[[4,8-bis[(2-ethylhexyl) oxy] benzo [1,2-b:4,5-b'] dithiophene-2,6-diyl] [3-fluoro-2-[(2-ethylhexyl) carbonyl] thieno [3,4-b] thiophenediyl]] (PTB7), PCPDTBT and P3HT. The donor semiconductive polymer is blended with an electron acceptor material to form the organic photon absorbing layer with a thickness between 20 nm and 400 nm. The electron acceptor material is based on $PC_{70}BM$.

Figure 2:
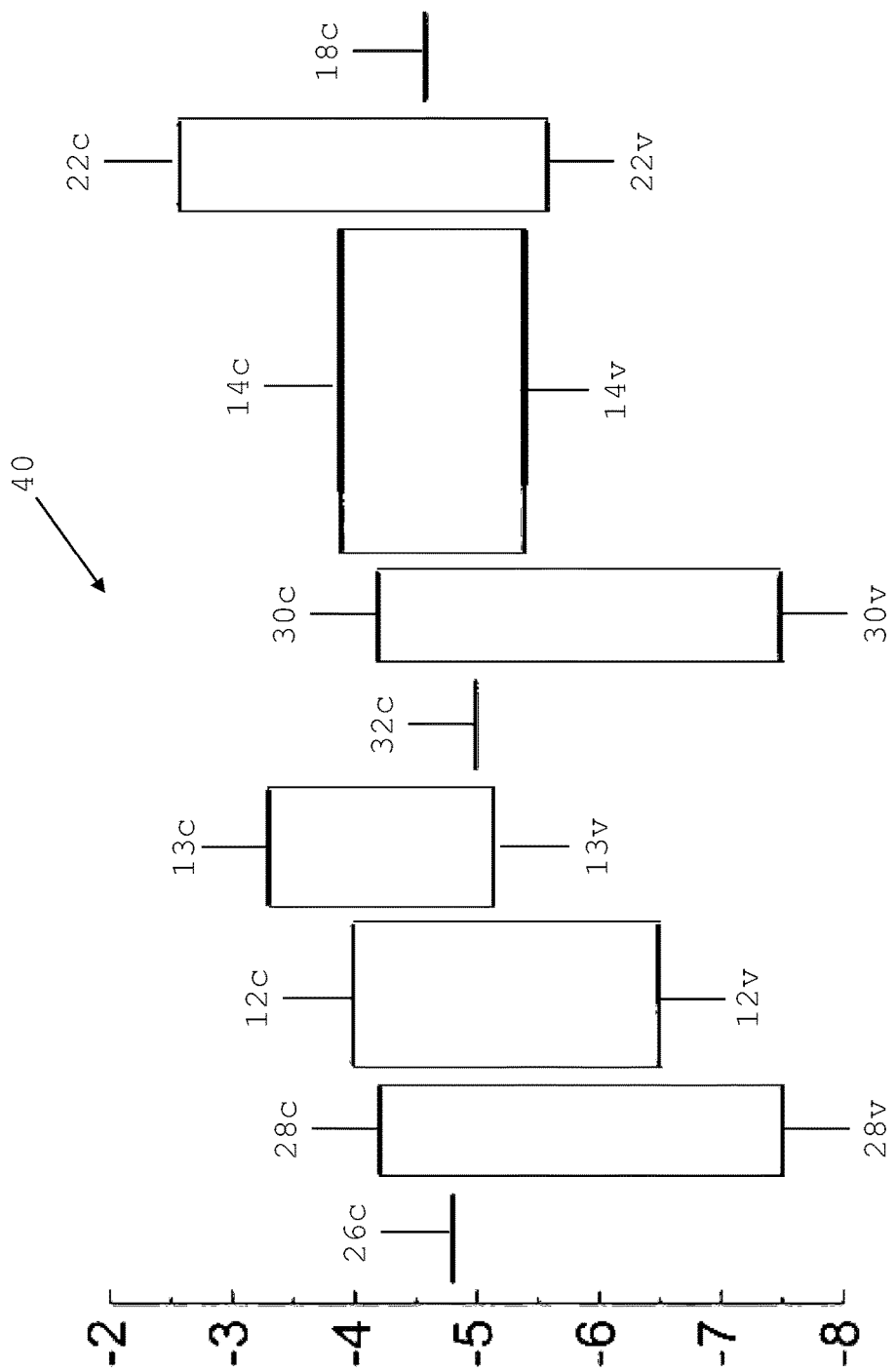
FIG. 2 is an energy band representation of the device in accordance with an embodiment.

Referring now to FIG. 2, there is shown an energy band representation 40 of the device 10. This representation does not show up-converting layer 16. Energy levels in FIG. 2 are referred to the vacuum level. FIG. 2 shows the conduction and valence band edges, respectively 12c and 12v, of organic layer 12. The conduction band edge 12c is placed between the conduction band edges of the PTB7 material, 13c, and the ZnO layer 28c. This configuration of the conduction band edges allows electrons to flow towards ITO layer 26, which has a lower conduction band edge, 26c, and then contacting structure 20. Electrons generated in the first solar cell are prevented from travelling towards the second solar cell by the conduction band edges of the PTB7 material, 13c.

The configuration of the conduction band edges of the various layers in FIG. 2 is mirrored by the configuration of the valence band edges of the first solar cell. The valence band edge 12v is placed between the valence band edges of the PTB7 material, 13v, and the ZnO layer 28v. This configuration of the valence band edges allows holes to flow towards the PEDOT:PSS conductive layer 32c and recombine with electrons coming from the second solar cell. Holes generated in the first solar cell are prevented from travelling towards the ITO layer 26.

The energy bands of the second solar cell in FIG. 2 show the same trend discussed with reference to the first solar cell. Conduction band edge 22c prevents electrons from reaching the contact 18 and valence band edge 30v prevents holes from reaching the PEDOT:PSS conductive layer 32. Electrons generated in the second solar cell recombine with holes coming from the first solar cell in the PEDOT:PSS conductive layer 32. Holes generated in the second solar cell can be extracted through contact 18.

Figure 3:
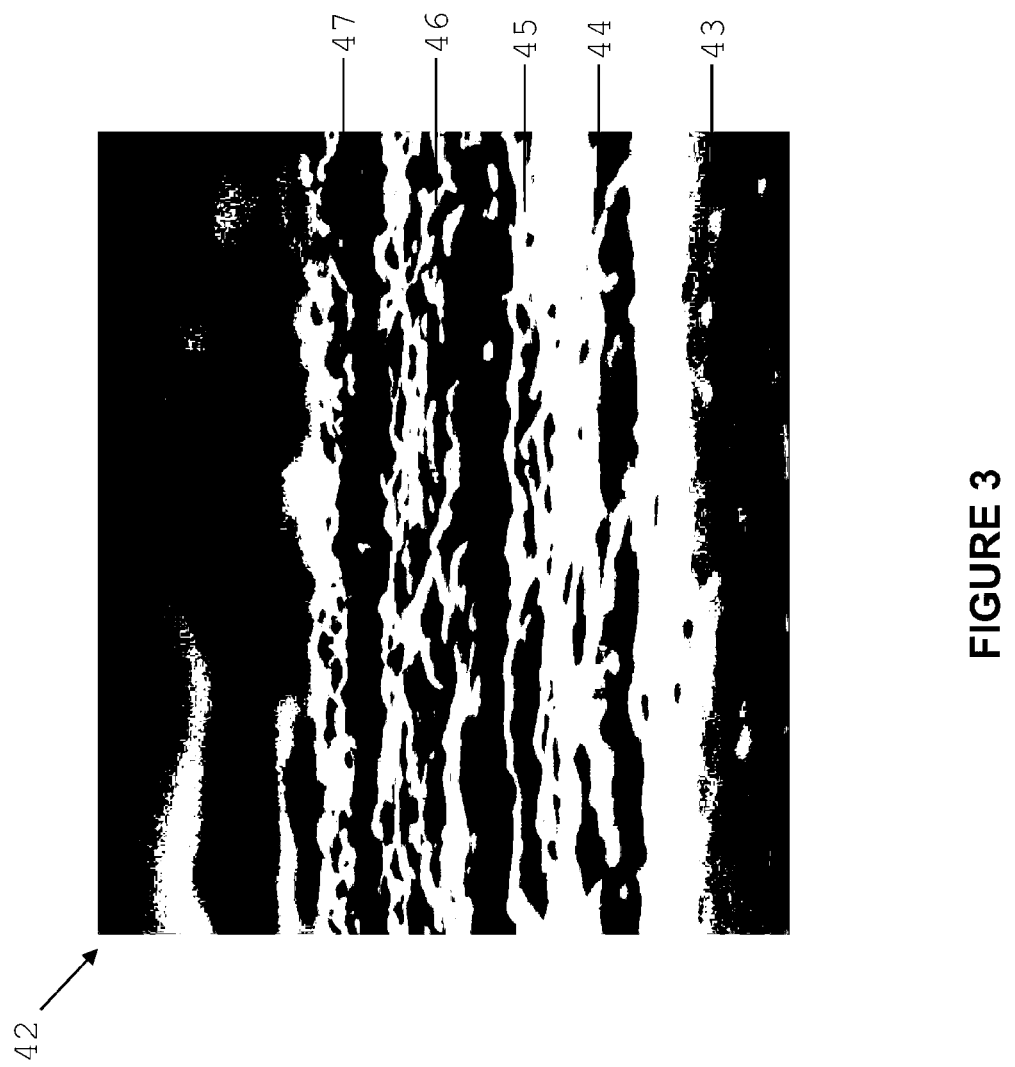
FIG. 3 is a scanning electron microscope image of a perovskite single junction solar cell.

Referring now to FIG. 3, there is shown a scanning electron microscope image of a perovskite single junction solar cell 42. Solar cell 42 is used as a bottom cell for the device 10 of FIG. 1. In the example of FIG. 3, solar cell 42 is deposited directly on a glass substrate 43 coated with an FTO layer 44, as in this example there is no organic top cell. A first layer of compact $TiO_2$ 45 is formed on the FTO layer 44. The light-absorbing perovskite layer 46 is realised onto a porous region of the $TiO_2$ layer 45 and coated with a silver layer 47.

The $TiO_2$ layer 45 has a mesoporous structure and is deposited by aerosol spray pyrolysis. It has a thickness of 350 nm and is composed of 20 nm sized particles. Layer 45 was infiltrated with $PbI_2$ by spin-coating a $PbI_2$ solution in DMF (462 mg ml) that was kept at 70° C. After drying, layer 45 was dipped in a solution of $CH_3NH_3I$ in 2-propanol (10 mg ml) for 20 s and rinsed with 2-propanol. The light-absorbing perovskite layer 46 is realised by spin-coating a solution of spiro-MeOTAD, 4-tert-butylpyridine, lithium bis(trifluoromethylsulphonyl) imide and tris(2-(1H-pyrazol-1-yl)-4-tert butylpyridine)cobalt(III) bis(trifluoromethylsulphonyl)imide in chlorobenzene.

Silver layer 47 is deposited by thermal evaporation on top of the device to form the back contact. For the fabrication of the best-performing devices, slightly modified conditions were used. In alternative embodiments, $PbI_2$ was spin-cast for 5 s and the devices were subjected to a 'pre-wetting' by dipping in 2-propanol for 1 s or 2 s before being dipped in the solution of $CH_3NH_3I$ and 2-propanol.

Figure 4:
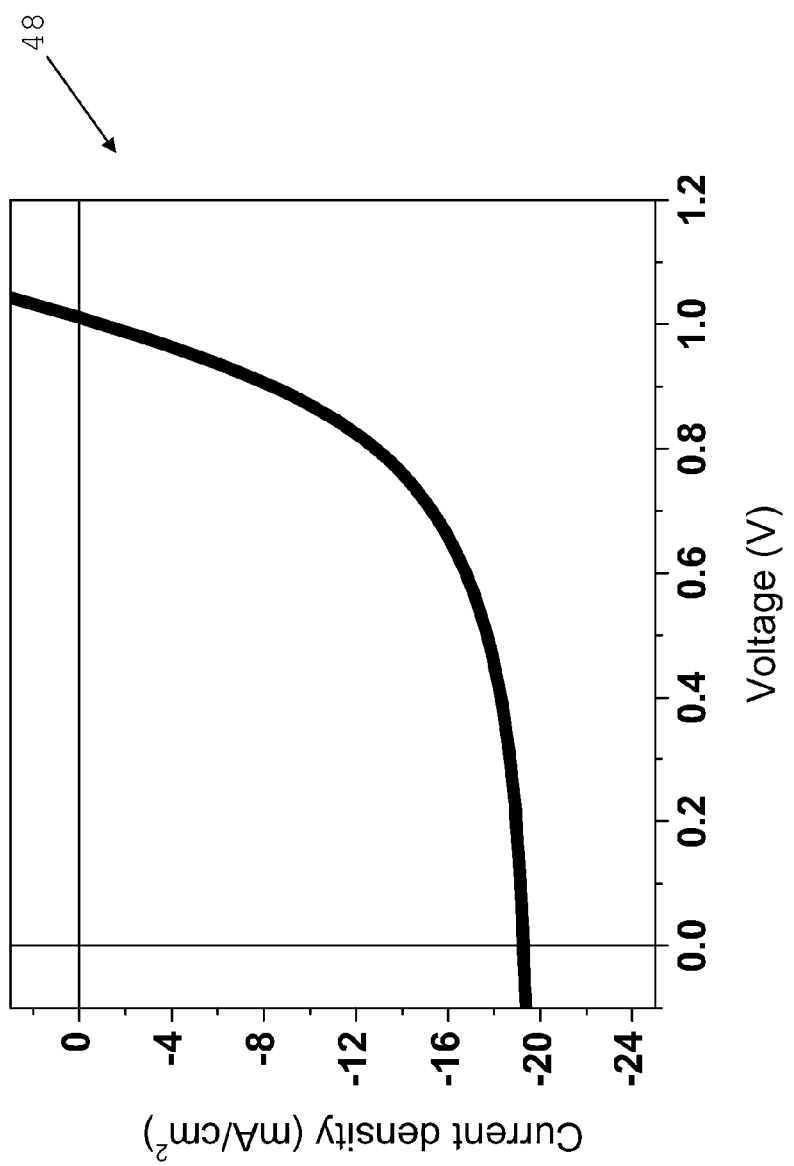
FIG. 4 is a current-voltage curve measured for the device of FIG. 3.

FIG. 4 is a current-voltage curve 48 measured on solar cell 42. The evaluation of the performance of this single solar cell is important to design the integrated device described with reference to FIG. 1. For example, the properties of light-absorbing layer can be designed so that, in operation, the current flowing through the top and bottom solar cells in the tandem configuration is matched. The short circuit current for cell 42 is $J_{SC}$=19 mA/cm², the open circuit voltage is $V_{OC}$=1.05 V, the fill factor is FF=0.65 and the efficiency is η=12%.

Figure 5:
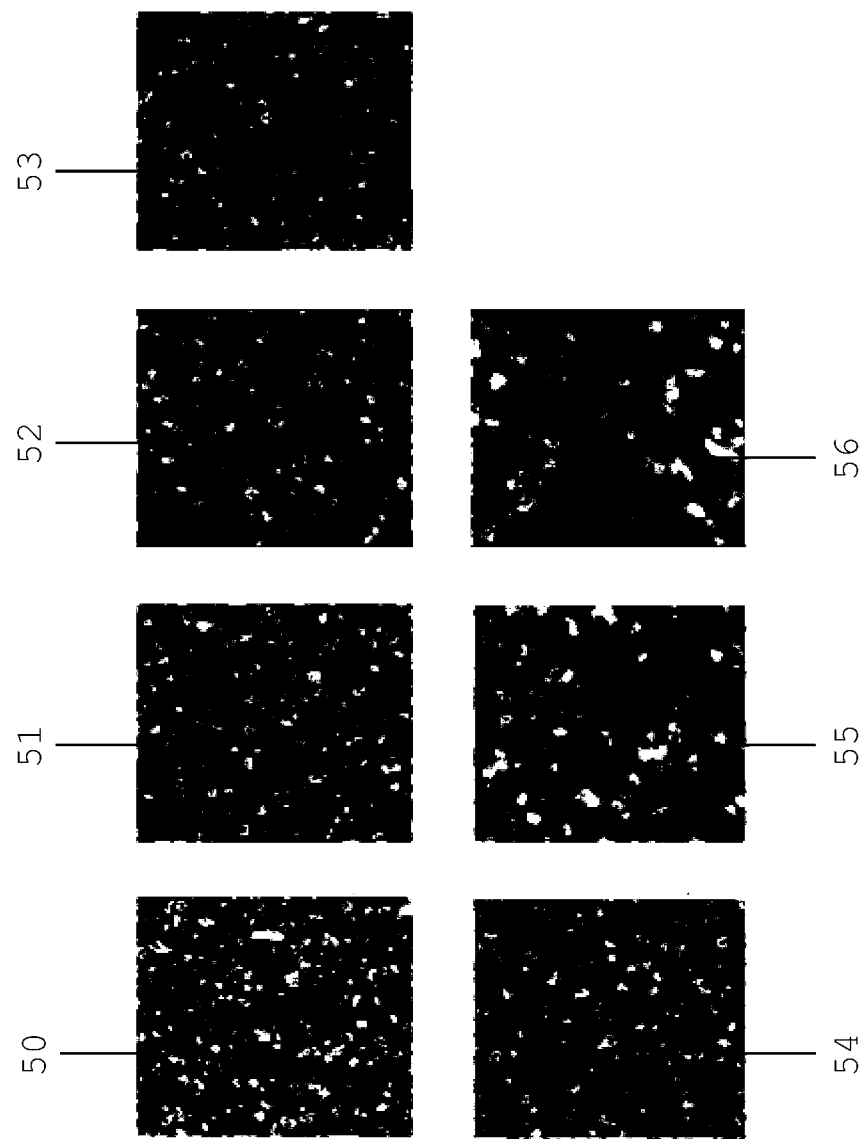
FIG. 5 shows atomic force microscope images of surfaces of an organic single junction solar cell.

Referring now to FIG. 5, there are shown several atomic force microscope images (50 to 56) of surfaces of an OPV single junction solar cell. Each of the images shows a surface topography of an area 5 μm×5 μm large of an active layer of the cell with a 15 nm vertical scale (lighter colour features are higher than darker colour features). Images 50 to 53 show the surface of a PCPDTBT:PC71BM layer and images 54 to 56 show the surface of a PTB7:PC71BM layer.

FIG. 5 provides information about phase segregation in the active layer of the OPV cell. An ordered nano-morphology in the active layer can help to reduce the binding energy of charge transfer excitons at the donor-acceptor interface. Enhanced phase separation with suitable donor-acceptor domain sizes is required for efficient charge generation. Layers 50 to 53, have a low surface roughness and small domain sizes. Layers 54 to 56 have an higher surface roughness and domain size. By using a morphology control agent the surface roughness and domain size can be modulated in PTB7:PC71BM for high efficiency cells.

Figure 6:
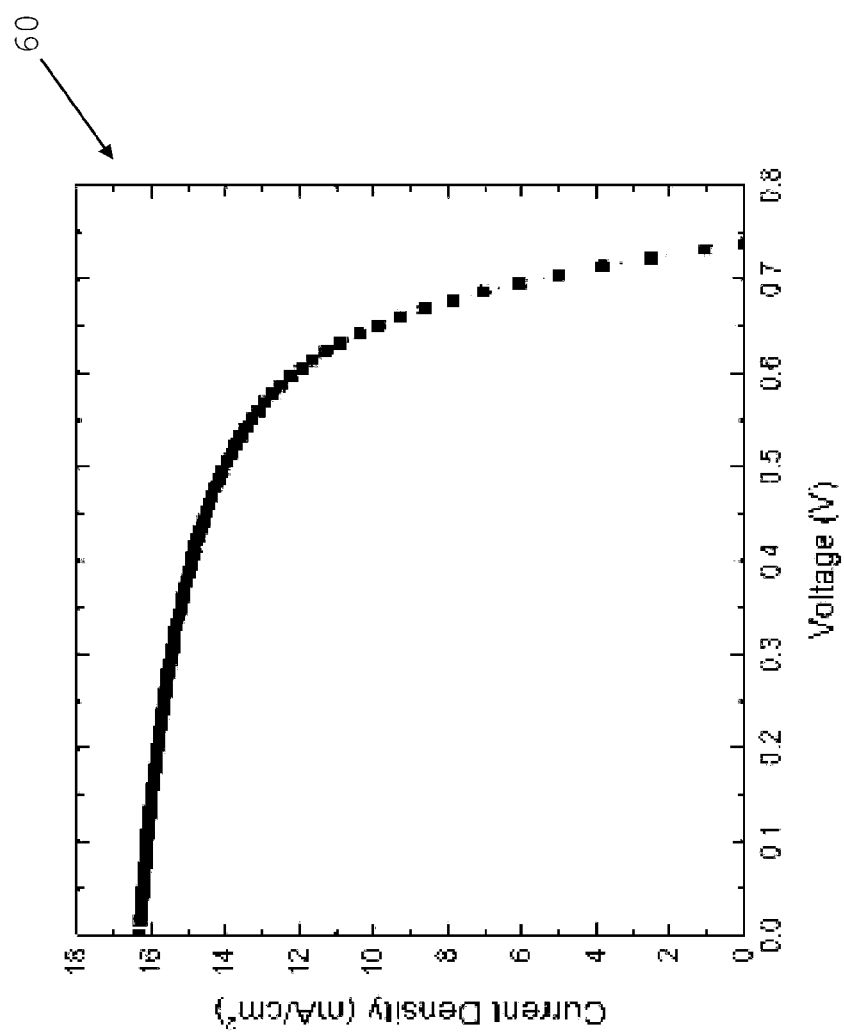
FIG. 6 is a current-voltage curve measured an organic single junction solar cell with a PTB7:PC71BM active layer.

The OPV devices are fabricated using a multi-layered structure of ITO/ZnO/active layer/MoO$_3$/Ag. Patterned indium tin oxide (ITO) glass substrates (12 mm×12 mm) were used for this device fabrication. The ZnO precursor was formed. 0.1 g zinc acetate dihydrate (Zn(CH3COO) 2.2H2O) and 1 ethanolamine (NH2CH2CH2OH) were dissolved in 1 ml 2-methoxyethanol (CH3OCH2CH2OH). This solution was stirred for 1 h in air. The ZnO precursor was then spun cast on the ITO coated glass at 3000 rpm for 30 s. After spin coating, the samples were immediately annealed at 150° C. for 1 h to form a ~20 nm ZnO buffer layer. The blend solutions were composed of PC71BM, and PDP or PTB7 in 1,2-dichlorobenzene. The solution was stirred overnight on a hotplate at 40° C. in a N$_2$ purged glove-box. A thick active layer of 100 nm was spin coated on top of the ZnO layer at 1200 rpm for 30 s. A 10 nm thick MoO$_3$ buffer layer was then thermally evaporated at a rate of 0.6 Å/s. The device is completed with a thermal evaporation of a 100 nm silver (Ag) electrode FIG. 6 is a current-voltage curve 60 measured an organic single junction solar cell with a PTB7:PC71BM active layer. As discussed with reference to FIG. 4, the data of curve 60 are important for the design of the integrated device of FIG. 1. The short circuit current for cell 42 is $J_{SC}$=17.5 mA/cm$^2$, the open circuit voltage is $V_{OC}$=0.75 V, the fill factor is FF=0.63 and the efficiency is η=8%.

Figure 7:
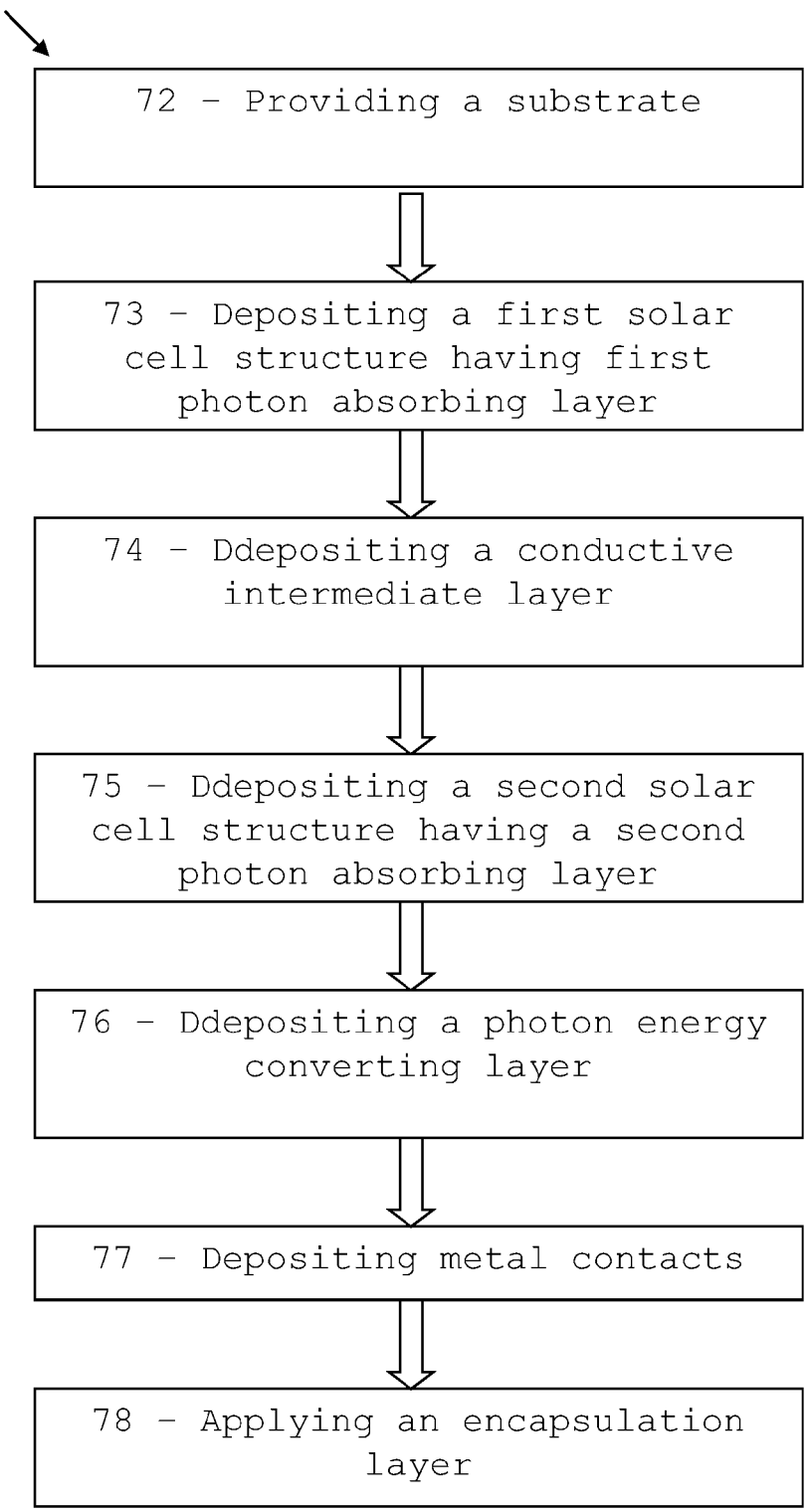
FIG. 7 is a flow diagram outlining a series of method steps to manufacture a photovoltaic device in accordance with an embodiment of the invention.

Referring now to FIG. 7, there is shown a flow diagram 70 outlining a series of method steps to manufacture device 10. The first step of the method consists in providing a suitable substrate to deposit the device upon 72. The substrate is typically coated with a conductive transparent oxide, such as ITO.

The first solar cell structure with the first photon absorbing layer is then deposited onto the substrate, for example by following the procedure outlined above with reference to FIG. 5, step 73. A conductive intermediate layer is then deposited to facilitate the interconnection of the two cells, step 74. Following the deposition of the intermediate layer, the second solar cell structure with the second photon absorbing layer is deposited, for example by following the procedure outlined above with reference to FIG. 3, step 75. After the spin coating step of the second solar cell, a photon energy converting layer is deposited using a chemical deposition technique, step 76. Metallic contacts are deposited, for example by metal evaporation, to the second solar cell, step 77 and finally an encapsulation layer is applied, step 78.

One of the first and second photon absorbing layers comprises a Perovskite material and the other one of photon absorbing layers comprises an organic material.

One of the advantages of the method is that several of the materials required to manufacture the photovoltaic device can be deposited using a spin coating technique. This includes both the organic and Perovskite absorbers. The Perovskite absorber may be thermally grown. ZnO layers and conductive PEDOT:PSS can also be spin coated. The final MoO$_3$ layer can be thermally deposited. An NaYF4:Er photon energy converting layer may be deposited, for example, by thermal decomposition of rare-earth/sodium trifluoroacetate precursors in oleic acid (OA) and octadecene (ODE).

The method described above is simpler and less expensive than processes used to manufacture current wafer based solar cells. This method is suitable for coating of large surfaces and potentially flexible substrates. The entire method can be performed, in some embodiments, at temperatures below 160° C.

Figure 8:
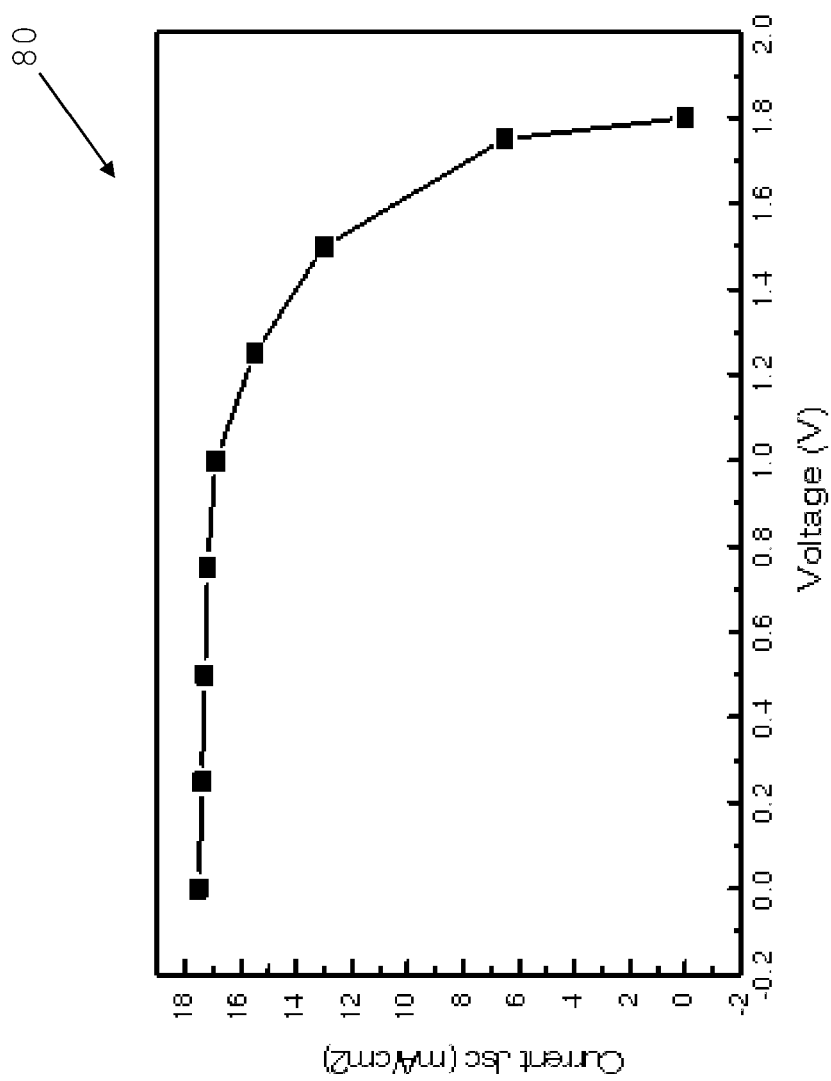
FIG. 8 is a current-voltage curve measured on a device manufactured in accordance with an embodiment of the invention.

Referring now to FIG. 8 there is shown a current-voltage curve 70 measured for a device manufactured in accordance with an embodiment of the invention. The measured $V_{OC}$ is 1.8 V which is higher than the $V_{OC}$ for any organic solar cell or Perovskite solar cell. The measured $J_{SC}$ is 17.5 mA/cm$^2$ and the measured fill factor is 60%. The fill factor may be affected by peripheral carrier collection and may be lower than the actual fill factor of the device. This results in a measured efficiency of 19%.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The claims as defined in the invention are as follows:

1. A photovoltaic device comprising:
   a photon receiving surface;
   a first solar cell structure having a photon absorbing layer comprising an organic material having a first bandgap, wherein the organic material comprises a donor semiconductive polymer that is blended with an electron acceptor material to form a photoactive layer; and
   a second solar cell structure having a photon absorbing layer comprising a material that has a Perovskite structure and having a second bandgap, the Perovskite having a formula of MAPb$_{(1-x)}$Sn$_x$X$_3$, wherein MA stands for methyl ammonium, and X is one or more halides;
   wherein the first solar cell is disposed between the photon receiving surface and the second solar cell and the photovoltaic device is arranged such that received photons are absorbed by at least one of the first and the second solar cell structure, and
   wherein the first bandgap is larger than the second bandgap.

2. The device according to claim 1 wherein the device comprises a photon energy converting layer arranged to convert received photons having an energy below the second bandgap into photons with an energy above the second bandgap and wherein the photovoltaic device is arranged such that energy converted photons are absorbed by at least one of the first and the second solar cell structure.

3. The device according to claim 2 wherein the photon energy converting layer is disposed adjacent the photon receiving surface.

4. The device according to claim 3 wherein the photon energy converting layer includes at least a portion of the photon receiving surface.

5. The device according to claim 2 wherein the photon energy converting layer is disposed between the first solar cell and the second solar cell.

6. The device according to claim 2 wherein the device further comprises a conductive layer arranged to extract electrical carriers from the device and the photon energy converting layer is disposed between the conductive layer and the second solar cell.

7. The device according to claim 6 wherein the conductive layer comprises silver.

8. The photovoltaic device according to claim 2 wherein the photon energy converting layer is an up-converting layer comprising NaYF4:Er.

9. The photovoltaic device according to claim 1 further comprising an interconnecting region between the first solar cell and the second solar cell, the interconnecting region being arranged to facilitate the passage of current between the first and the second solar cell.

10. The photovoltaic device according to claim 9 wherein the interconnecting region extends across at least a portion of the first or the second solar cell and further comprises one or more intermediate layers disposed between the photon absorbing layer of the first solar cell and the photon absorbing layer of the second solar cell.

11. The photovoltaic device according to claim 10 wherein at least one intermediate layer comprises a ZnO layer or a $MoO_3$ layer and is arranged to reduce passage of electrons or holes from one solar cell to the other.

12. The photovoltaic device according to claim 10 wherein the at least one intermediate layer is arranged to alter the distribution of electrical field within at least one of the first and the second solar cell.

13. The photovoltaic device according to claim 1 wherein the Perovskite material has a thickness between 500 nm and 1500 nm.

14. The photovoltaic device according to claim 1 wherein the organic material has a thickness between 20 nm and 400 nm.

* * * * *